US012622146B2

(12) United States Patent　　　(10) Patent No.:　US 12,622,146 B2

Iwakawa et al.　　　(45) Date of Patent:　May 5, 2026

(54) SELF-LIGHT EMITTING DEVICE

(71) Applicant: Mitsubishi Electric Corporation, Tokyo (JP)

(72) Inventors: Manabu Iwakawa, Tokyo (JP); Kazunori Inoue, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 447 days.

(21) Appl. No.: 18/279,878

(22) PCT Filed: Mar. 10, 2021

(86) PCT No.: PCT/JP2021/009460
§ 371 (c)(1),
(2) Date: Sep. 1, 2023

(87) PCT Pub. No.: WO2022/190235
PCT Pub. Date: Sep. 15, 2022

(65) Prior Publication Data

US 2024/0145446 A1　　May 2, 2024

(51) Int. Cl.
H10K 59/35 (2023.01)
H01L 25/13 (2006.01)
H10K 59/10 (2023.01)

(52) U.S. Cl.
CPC ............. H10K 59/35 (2023.02); H01L 25/13 (2013.01); H10K 59/10 (2023.02)

(58) Field of Classification Search
CPC ........ H10K 59/35; H10K 59/10; H01L 25/13; H01L 25/0753; G09F 9/40
See application file for complete search history.

(56) References Cited

U.S. PATENT DOCUMENTS

2007/0001927 A1　1/2007　Ricks et al.

FOREIGN PATENT DOCUMENTS

| CN | 110112187 A | * | 8/2019 | ........... H10K 59/121 |
|---|---|---|---|---|
| JP | 2010-282009 A | | 12/2010 | |
| JP | 2012-238001 A | | 12/2012 | |
| JP | 2014-075547 A | | 4/2014 | |

OTHER PUBLICATIONS

English Machine Translation of Fan: Chinese Pub. No. CN-110112187-A, (Year: 2025).*
International Search Report and Written Opinion mailed on May 25, 2021, received for PCT Application PCT/JP2021/009460, filed on Mar. 10, 2021, 11 pages including English Translation.
Biwa et al., "Technologies for the Crystal LED Display System", SID 2019 Digest, vol. 11, No. 1, 2019, pp. 121-124.

* cited by examiner

*Primary Examiner* — Donald L Raleigh
(74) *Attorney, Agent, or Firm* — XSENSUS LLP

(57)　　　ABSTRACT

A self-light emitting device in a tiling scheme includes an array of a plurality of self-light emitting units. Each of the self-light emitting units is partitioned into a plurality of unit regions, and each of the unit regions includes at least one light emitting cell each including one or more self-light emitting elements. A central portion and an outer edge portion of each self-light emitting unit differ in number or positions of one or more light emitting cells in each unit region.

11 Claims, 9 Drawing Sheets

F I G.  1
100
1
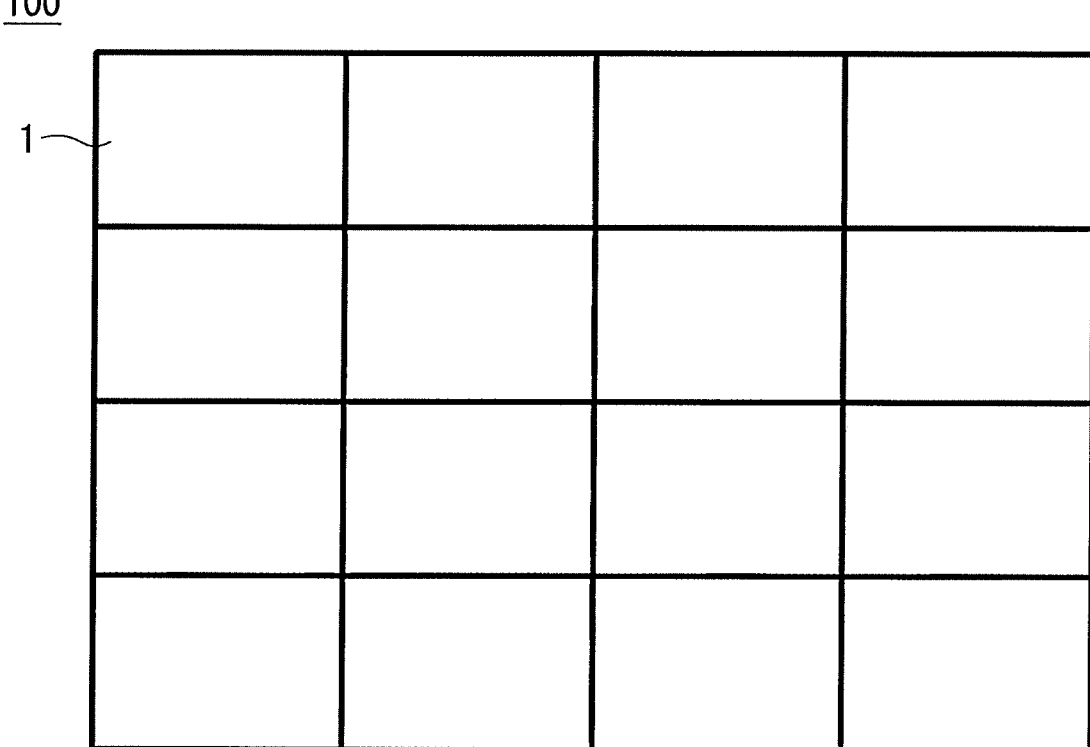

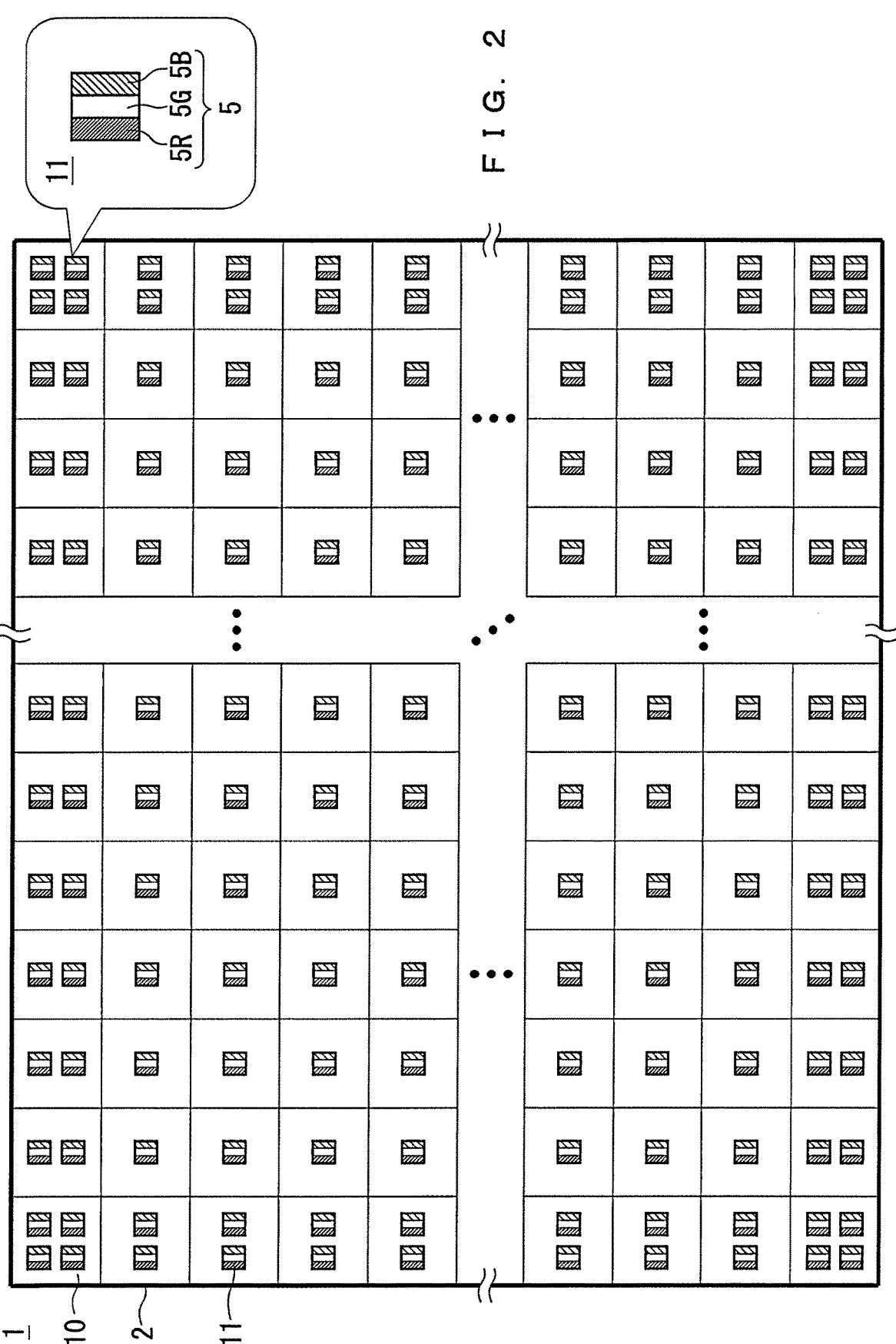
F I G. 2

F I G.  3
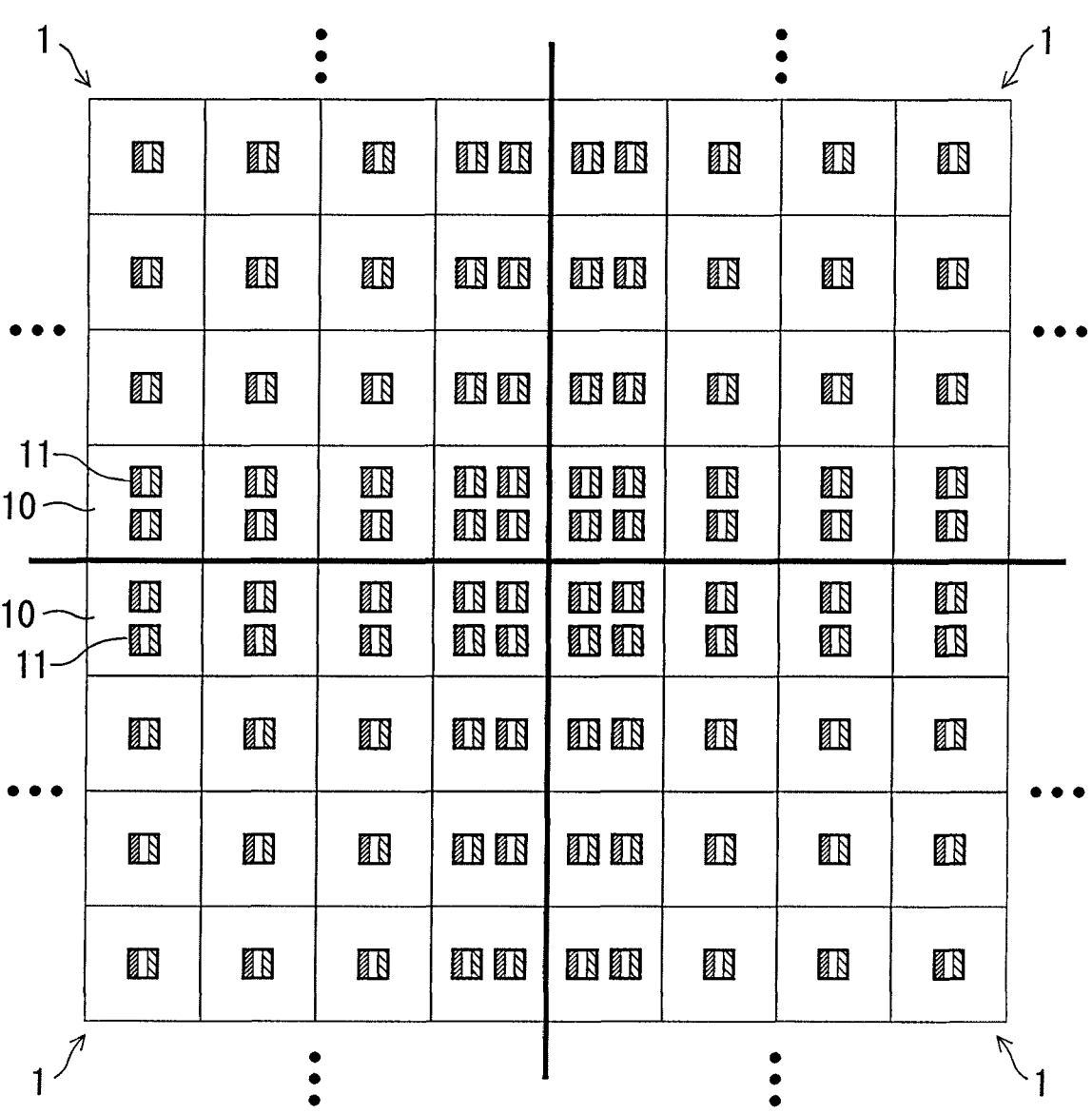

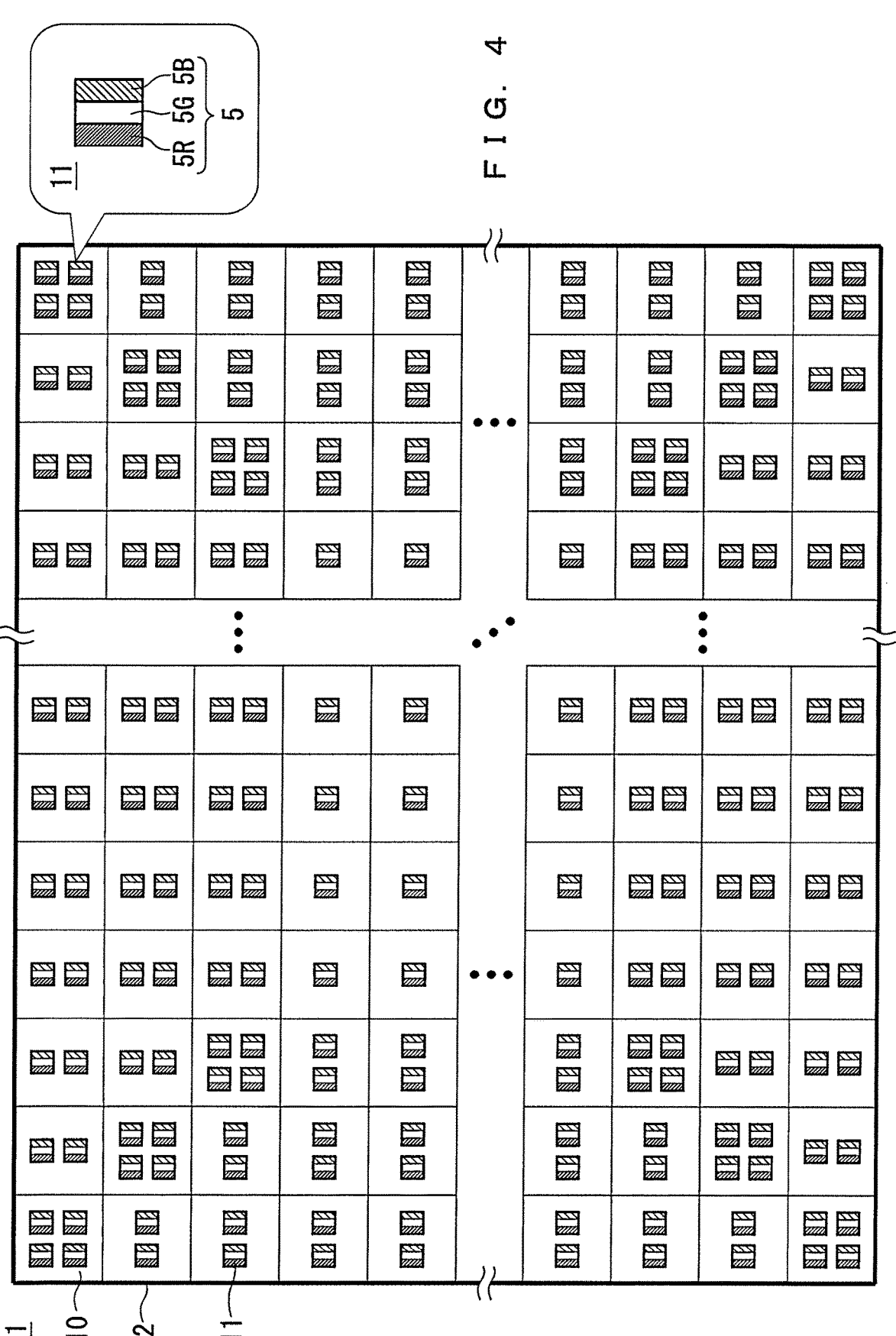
F I G. 4

F I G.  5
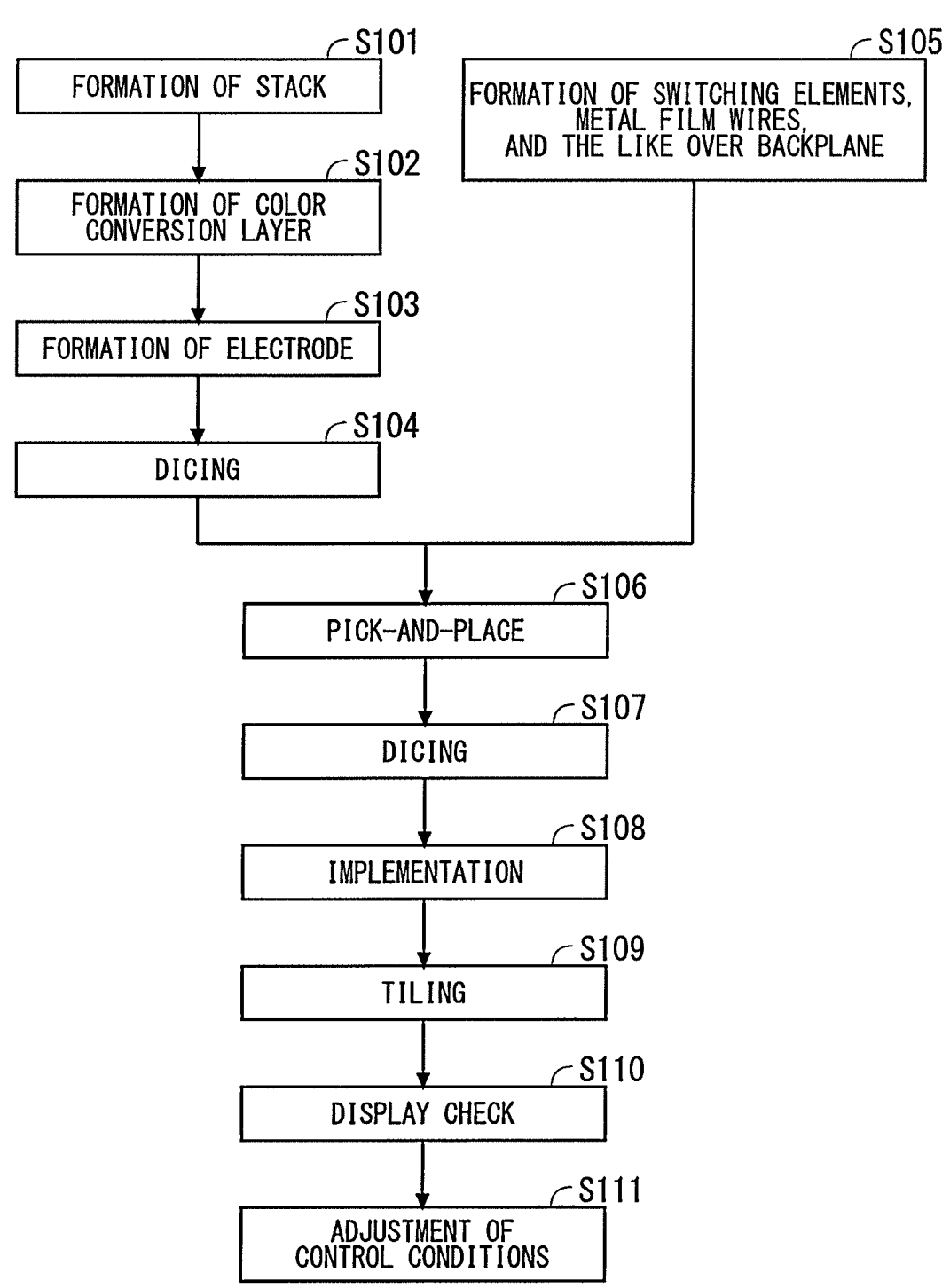

F I G. 6
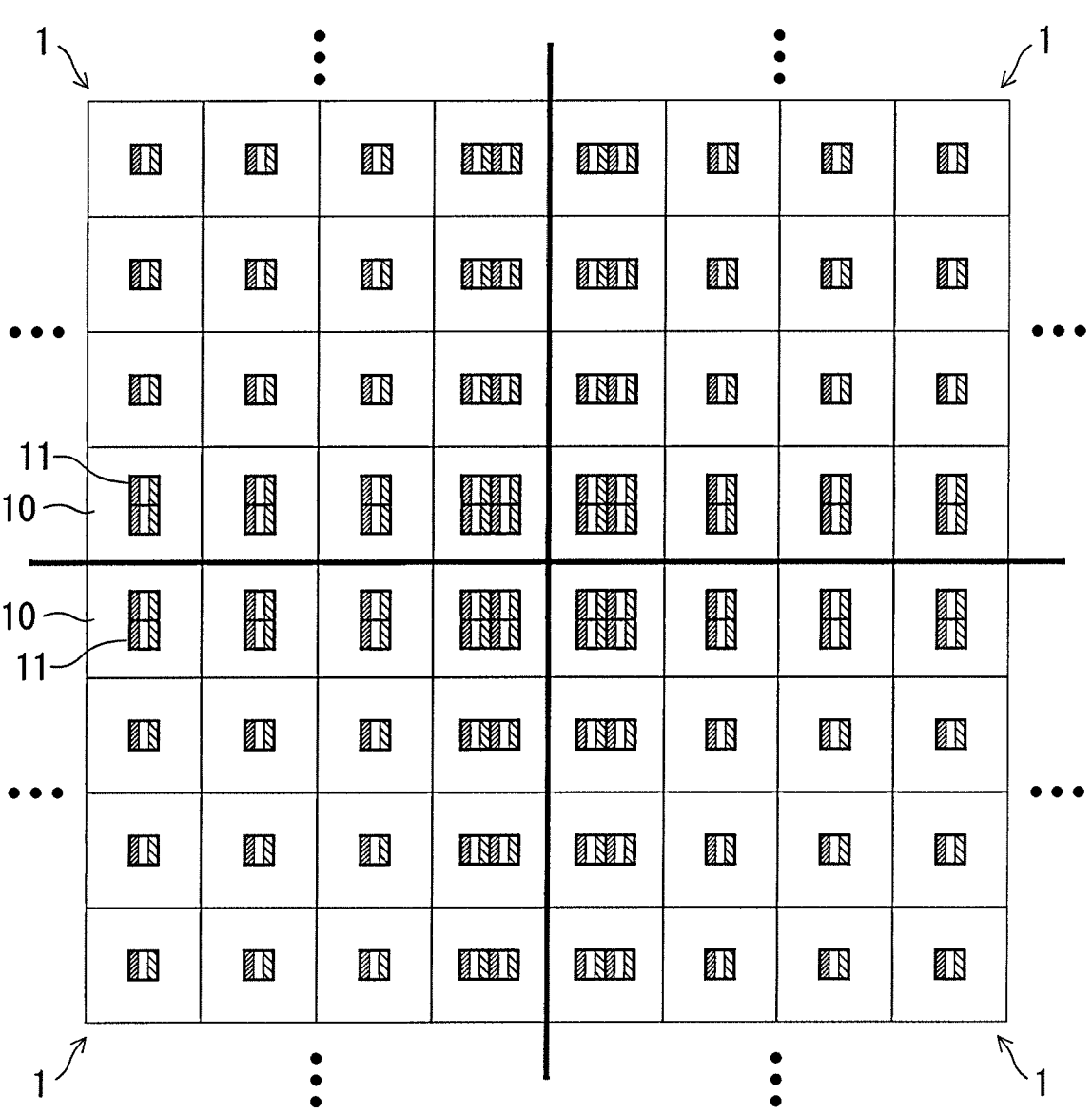

F I G.  7
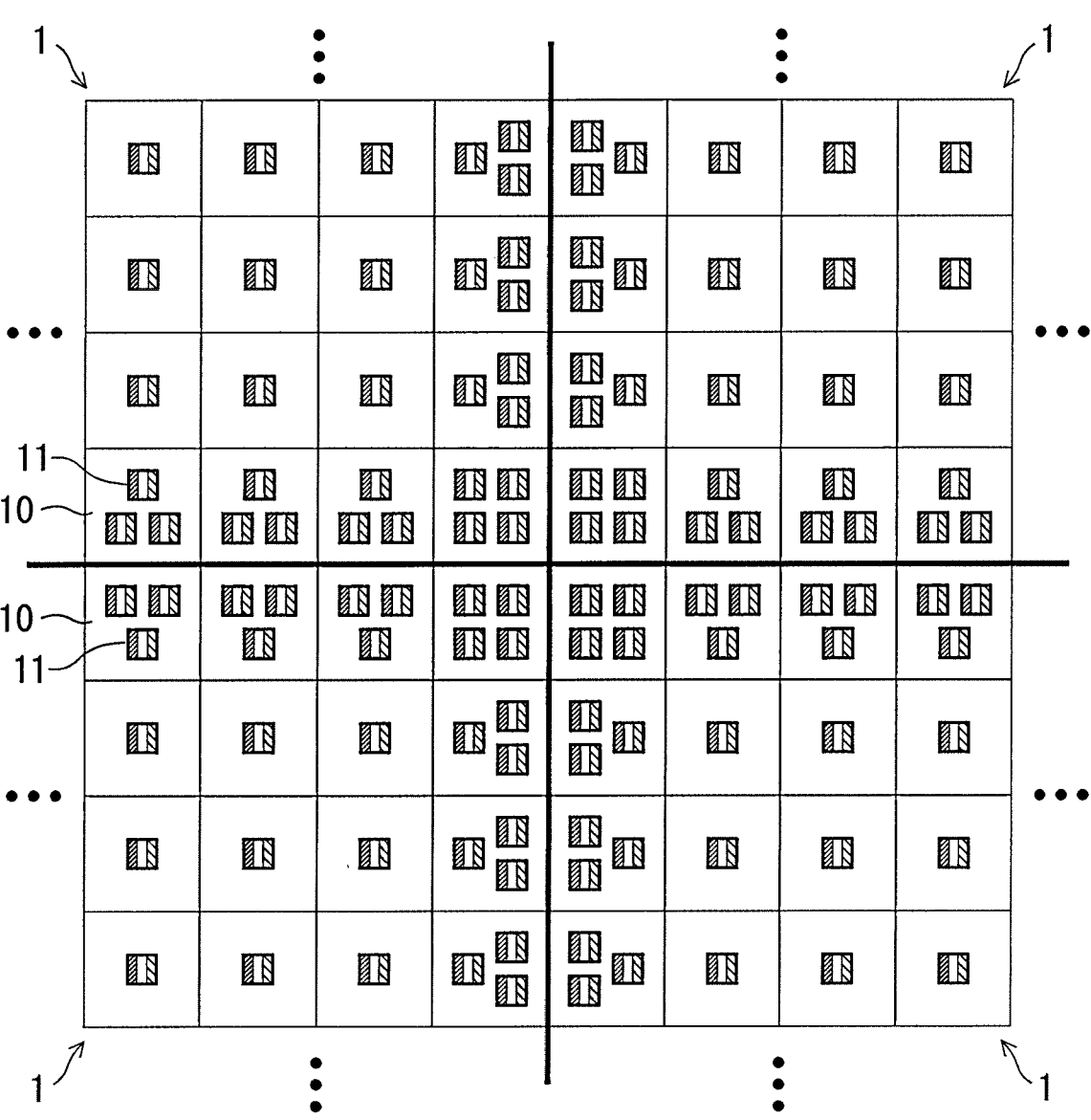

F I G.  8
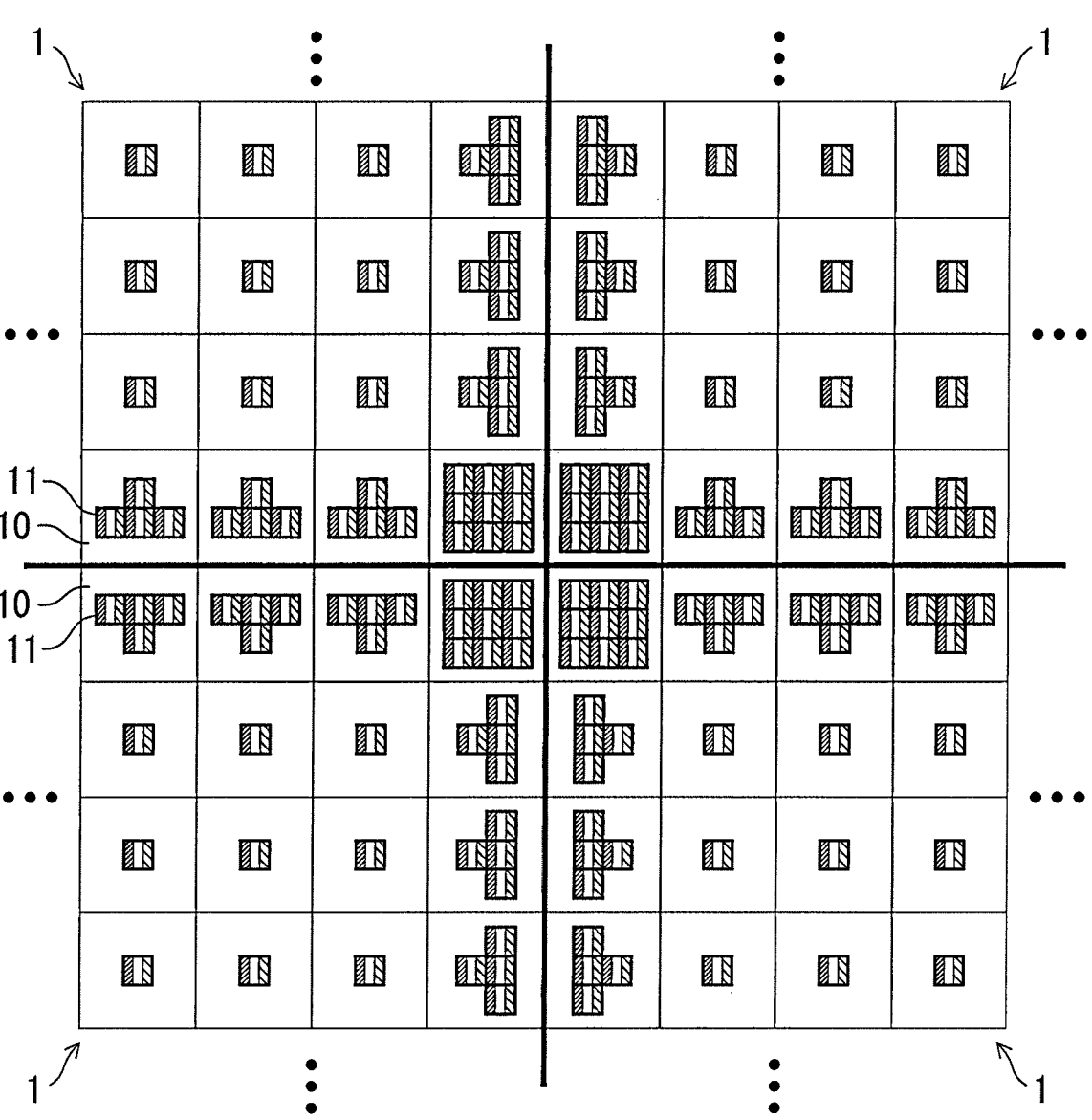

F I G.  9
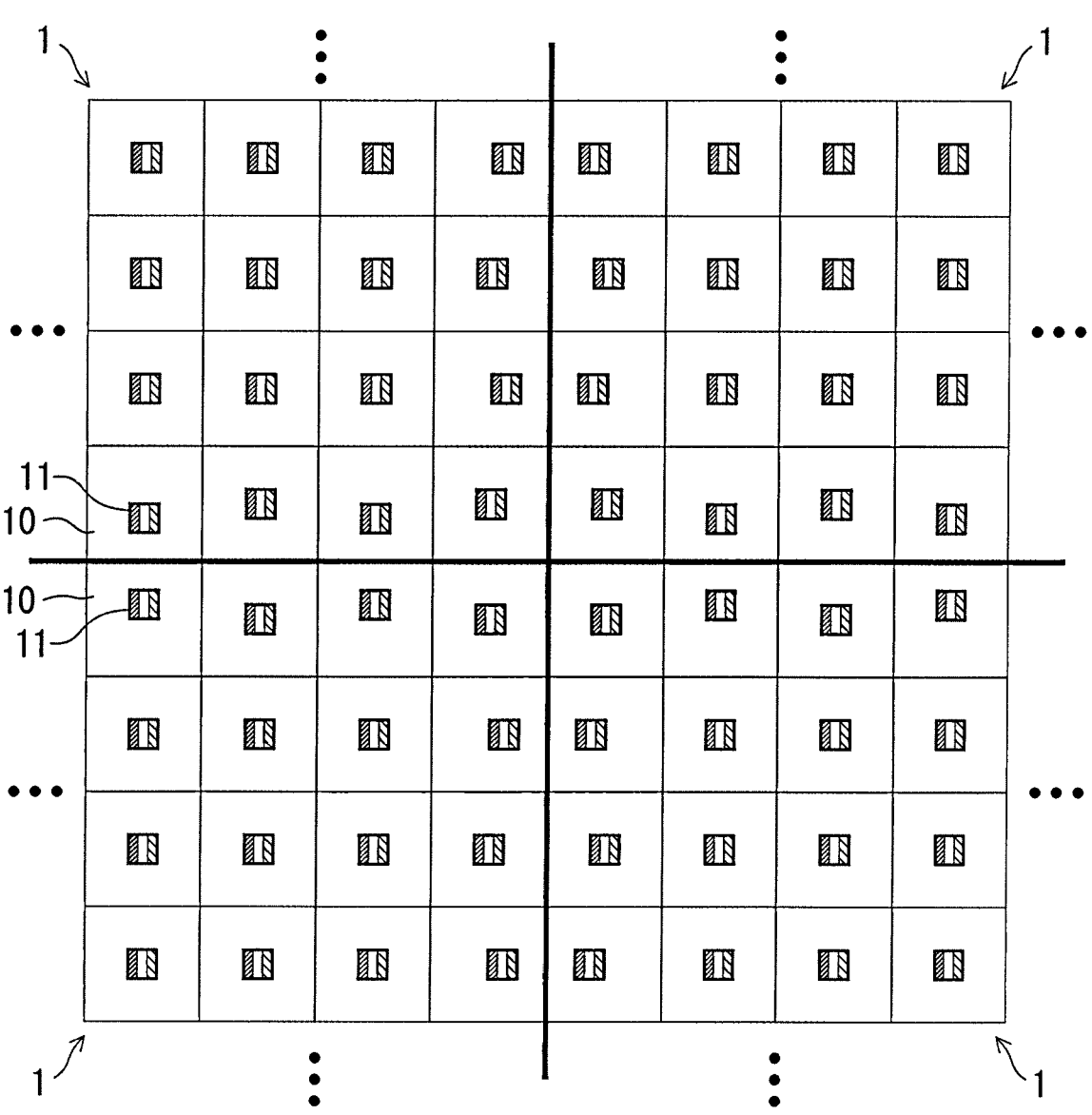

SELF-LIGHT EMITTING DEVICE

CROSS-REFERENCE TO RELATED APPLICATION

The present application is based on PCT filing PCT/JP2021/009460, filed Mar. 10, 2021, the entire contents of which are incorporated herein by reference.

TECHNICAL FIELD

The present disclosure relates to a self-light emitting device in a tiling scheme including an array of a plurality of self-light emitting units.

BACKGROUND ART

In the field of display devices, a self-light emitting device including self-light emitting elements, such as organic electro-luminescence (OEL) and light emitting diodes (LEDs), as a light source has been widely used in recent years. For example, an organic light emitting electro-luminescence display is a self-light emitting device including OEL as pixels, and a micro LED display is a self-light emitting device including minute LEDs (also referred to as "μLEDs") as respective pixels. The self-light emitting device including the μLEDs is considered for diversion to a backlight of a liquid crystal display (LCD). Brightness of the backlight including the μLEDs is locally controllable, so that a display quality of the LCD, whose low contrast has been problematic, can be improved by controlling brightness in each region on the backlight in accordance with an image displayed on the LCD. Such a backlight is referred to as a local dimming backlight.

A self-light emitting device in a tiling scheme, which is a large self-light emitting device formed by arranging a plurality of self-light emitting units as small self-light emitting devices, is also known. In the self-light emitting device in the tiling scheme, it is important to make boundaries between the self-light emitting units less noticeable. As technology for making the boundaries between the self-light emitting units less noticeable, Patent Document 1 below discloses technology of folding a region (non-display region) outside a display region of each of self-light emitting units over a back side to narrow a width of a boundary (seam) between self-light emitting units, for example. Patent Document 2 below discloses technology of overlapping non-display regions of adjacent self-light emitting units to narrow a width of a boundary between the self-light emitting units.

PRIOR ART DOCUMENTS

Patent Documents

Patent Document 1: Japanese Patent Application Laid-Open No. 2014-075547
Patent Document 2: Japanese Patent Application Laid-Open No. 2012-238001

SUMMARY

Problem to be Solved by the Invention

In technology disclosed in each of Patent Documents 1 and 2, noticeability of the boundary between the self-light emitting units due to a large width of the boundary can be prevented, but noticeability of the boundary due to a pixel pitch mismatch between the self-light emitting units caused by misalignment between the self-light emitting units, a dimensional mismatch between the self-light emitting units, and the like cannot be prevented.

The present disclosure has been conceived to solve a problem as described above, and it is an object of the present disclosure to provide a self-light emitting device capable of making a boundary between adjacent self-light emitting units less noticeable even if a pixel pitch mismatch occurs between the self-light emitting units.

Means to Solve the Problem

A self-light emitting device according to the present disclosure is a self-light emitting device in a tiling scheme including an array of a plurality of self-light emitting units, wherein each of the self-light emitting units is partitioned into a plurality of unit regions, each of the unit regions includes at least one light emitting cell each including one or more self-light emitting elements, and a central portion and an outer edge portion of each self-light emitting unit differ in number or positions of one or more light emitting cells in each unit region.

Effects of the Invention

According to the self-light emitting device according to the present disclosure, a boundary between adjacent self-light emitting units can be made less noticeable even if a pixel pitch mismatch occurs between the self-light emitting units.

The objects, features, aspects and advantages of the present disclosure will become more apparent from the following detailed description and the accompanying drawings.

BRIEF DESCRIPTION OF DRAWINGS

FIG. 1 is a schematic plan view illustrating a configuration of a self-light emitting device according to Embodiment 1.

FIG. 2 is a schematic plan view illustrating a configuration of a self-light emitting unit according to Embodiment 1.

FIG. 3 is a schematic plan view illustrating a boundary portion among self-light emitting units of the self-light emitting device according to Embodiment 1.

FIG. 4 is a schematic plan view illustrating a modification of the configuration of the self-light emitting unit according to Embodiment 1.

FIG. 5 is a flowchart showing a process of manufacturing the self-light emitting device according to Embodiment 1.

FIG. 6 is a schematic plan view illustrating a boundary portion among self-light emitting units of a self-light emitting device according to Embodiment 2.

FIG. 7 is a schematic plan view illustrating a boundary portion among self-light emitting units of a self-light emitting device according to Embodiment 3.

FIG. 8 is a schematic plan view illustrating a boundary portion among self-light emitting units of a self-light emitting device according to Embodiment 4.

FIG. 9 is a schematic plan view illustrating a boundary portion among self-light emitting units of a self-light emitting device according to Embodiment 5.

DESCRIPTION OF EMBODIMENTS

Embodiments of technology according to the present disclosure will be described below. The drawings shown below are schematic views conceptually showing functions or structures of elements. The same or corresponding elements bear the same reference signs in a plurality of drawings, and thus redundant description will be omitted as appropriate in each embodiment.

Embodiment 1

FIG. 1 is a schematic plan view illustrating a configuration of a self-light emitting device 100 according to Embodiment 1. As illustrated in FIG. 1, the self-light emitting device 100 is a self-light emitting device in a tiling scheme including an array of a plurality of self-light emitting units 1.

FIG. 2 is a schematic plan view illustrating a configuration of a self-light emitting unit 1. FIG. 3 is a schematic plan view illustrating a boundary portion among self-light emitting units 1 of the self-light emitting device 100. Each self-light emitting unit 1 includes a plurality of light emitting cells 11 arranged over a backplane 2. Although not illustrated, a driving integrated circuit (IC) to drive the plurality of light emitting cells 11 is mounted to a back surface of the self-light emitting unit 1. When the self-light emitting unit 1 is a display device, the light emitting cells 11 are pixels as minimum units of color information of an image.

As illustrated in FIG. 2, the self-light emitting unit 1 is partitioned into a plurality of unit regions 10 arranged in a matrix. That is to say, the unit regions 10 are arranged in a horizontal direction (left-right direction of the page of FIG. 1) and in a vertical direction (top-bottom direction of the page of FIG. 1). Each of the plurality of unit regions 10 includes at least one light emitting cell 11, and each light emitting cell 11 includes one or more self-light emitting elements 5. Although not illustrated, a metal thin film wire, an electrode, a switching element, and the like to drive each self-light emitting element 5 of the light emitting cell 11 are arranged in an active area as a region where the light emitting cells 11 are arranged. A thin film transistor (TFT) is used as the switching element, for example.

As illustrated in a right portion of FIG. 2, in the present embodiment, one light emitting cell 11 includes three self-light emitting elements 5, namely a red LED element 5R, a green LED element 5G, and a blue LED element 5B, and, in each light emitting cell 11, the red LED element 5R, the green LED element 5G, and the blue LED element 5B are arranged in this order from left to right. The light emitting cell 11 may include four LED elements, namely the red LED element 5R, the green LED element 5G, and the blue LED element 5B plus a white LED element. The light emitting cell 11 may include self-light emitting elements other than LED elements, such as OEL elements.

In Embodiment 1, a central portion and an outer edge portion of the self-light emitting unit 1 differ in number of light emitting cells 11 in each unit region 10. More specifically, each of unit regions 10 in the outer edge portion of the self-light emitting unit 1 includes a greater number of light emitting cells 11 than each of unit regions 10 in the central portion of the self-light emitting unit 1. In an example of FIG. 2, from among the unit regions 10 in the outer edge portion of the self-light emitting unit 1, each of unit regions 10 in corner portions of an outer edge of the self-light emitting unit 1 includes a greater number of light emitting cells 11 than each of unit regions 10 in linear portions of the outer edge of the self-light emitting unit 1.

In FIGS. 2 and 3, each of the unit regions 10 in the central portion of the self-light emitting unit 1 includes one light emitting cell 11, each of the unit regions 10 in the linear portions of the outer edge of the self-light emitting unit 1 includes two light emitting cells 11, and each of the unit regions 10 in the corner portions of the outer edge of the self-light emitting unit 1 includes four light emitting cells 11. In each self-light emitting unit 1, the number of metal thin film wires, electrodes, switching elements, and the like to drive self-light emitting elements 5 of the light emitting cells 11 depends on the number of self-light emitting elements 5 in the self-light emitting unit 1.

In FIGS. 2 and 3, the two light emitting cells 11 in each of the unit regions 10 in the linear portions of the outer edge of the self-light emitting unit 1 are arranged in a direction perpendicular to the outer edge of the self-light emitting unit 1 (that is, a boundary of an adjacent self-light emitting unit 1). The four light emitting cells 11 in each of the unit regions 10 in the corner portions of the outer edge of the self-light emitting unit 1 are arranged in a 2×2 matrix so that two light emitting cells 11 are arranged in a direction perpendicular to each of two outer edges forming each of the corner portions.

From among a plurality of light emitting cells 11 in each of the unit regions 10 in the outer edge portion of the self-light emitting unit 1, at least one light emitting cell 11 is used as a basic cell controlled in a similar manner to each light emitting cell 11 in the unit regions 10 in the central portion of the self-light emitting unit 1, and one or more light emitting cells 11 other than the basic cell are used as correction cells for correction of brightness in a boundary portion between self-light emitting units 1.

In each of the unit regions 10 in the outer edge portion of the self-light emitting unit 1, the plurality of light emitting cells 11 are not necessarily required to be arranged in the direction perpendicular to the outer edge of the self-light emitting unit 1 (the boundary of the adjacent self-light emitting unit 1) unless the light emitting cells 11 are arranged in a direction parallel to the outer edge of the self-light emitting unit 1. That is to say, a direction in which the plurality of light emitting cells 11 are arranged and the outer edge of the self-light emitting unit 1 are only required to form an angle other than 0° and 180°. In other words, each of the unit regions 10 in the outer edge portion of the self-light emitting unit 1 is only required to include two or more light emitting cells 11 differing in distance from an outer end of the self-light emitting unit 1. More specifically, the light emitting cell 11 used as the basic cell and the one or more light emitting cells 11 used as the correction cells are only required to differ in distance from the outer end of the self-light emitting unit 1.

In FIGS. 2 and 3, the unit regions 10 in the outer edge portion of the self-light emitting unit 1, that is, unit regions 10 differing from the unit regions 10 in the central portion of the self-light emitting unit 1 in number of light emitting cells 11 are only unit regions 10 in an outermost edge portion of the self-light emitting unit 1. The "outer edge portion", however, may have a certain width. For example, FIG. 4 illustrates an example in which three rows of unit regions 10 from the outermost edge portion are the unit regions 10 in the outer edge portion.

A process of manufacturing the self-light emitting device 100 according to Embodiment 1 will be described next with reference a flowchart of FIG. 5.

First, a stack of a buffer layer, an n-type semiconductor layer, a light emitting layer, and a p-type semiconductor layer stacked in this order is formed over a substrate (step S101). A sapphire substrate is used as the substrate, for example.

Next, a phosphor, quantum dots, and the like are formed over the stack formed in step S101 as a color conversion layer (step S102). An electrode is further formed over the n-type semiconductor layer and the p-type semiconductor layer of the stack (step S103). The substrate is then diced into a desired size to form the LED elements as the self-light emitting elements 5 (the red LED element 5R, the green LED element 5G, and the blue LED element 5B) (step S104).

While the red LED element 5R, the green LED element 5G, and the blue LED element 5B illustrated in FIG. 2 are each rectangular, a shape of each of the self-light emitting elements 5 is not limited to a rectangular shape, and may be a square shape, for example. While the red LED element 5R, the green LED element 5G, and the blue LED element 5B illustrated in FIG. 2 are arranged with no gap therebetween, gaps formed by dicing in step S104 may be present between them.

Separately from a process of forming the self-light emitting elements 5 (steps S101 to S104), a process of preparing the backplane 2, specifically, a process of forming the switching elements, the metal thin film wires, the electrodes, and the like over the backplane 2 (step S105) is performed. A glass substrate, a glass epoxy substrate, and the like are used as the backplane 2, for example.

Next, the self-light emitting elements 5 are arranged in each unit region 10 on the backplane 2 by pick-and-place (step S106). A method for arranging the self-light emitting elements 5 is not limited to the pick-and-place, and another method using laser liftoff, an elastomeric stamp, static electricity, or magnetism and the like may be used, for example.

The backplane 2 to which the self-light emitting elements 5 have been mounted is then diced into a desired size (step S107). An electrode of each of the self-light emitting elements 5 is electrically connected to a switching element, and, further, the switching element is connected to a driving IC via a metal thin film wire. The self-light emitting elements 5 are thus implemented over the backplane 2 to form one or more light emitting cells 11 in each unit region 10 (step S108). A structure of the self-light emitting unit 1 is completed in the processes so far.

Next, a plurality of completed self-light emitting units 1 are arranged to have a desired area by tiling to form the self-light emitting device 100 including the plurality of self-light emitting units 1 (step S109).

Then, the self-light emitting device 100 is caused to emit light to check a display quality in boundary portions among the self-light emitting units 1 (step S110). Drive signals, video signals, or the like output from driving ICs are controlled based on a result of the check to make the boundary portions among the self-light emitting units 1 less noticeable to thereby adjust control conditions (e.g., a brightness ratio of the basic cell to the correction cells) for the light emitting cells 11 in the unit regions 10 in the outer edge portion of each self-light emitting unit 1 (step S111). Information on the adjusted control conditions is stored in a storage medium, such as memory. The self-light emitting device 100 is completed as described above.

The drive signals or the video signals controlled based on the adjusted control conditions are supplied from the driving ICs to the light emitting cells 11 in the unit regions 10 in the outer edge portion of each self-light emitting unit 1, and, as a result, the boundary portions among the self-light emitting units 1 are made less noticeable, and the display quality is improved.

Check of the display quality (step S110) and adjustment of the control conditions for the light emitting cells 11 (step S111) may be performed with respect to the unit regions 10 in the central portion of the self-light emitting unit 1. That is to say, brightness in all the unit regions 10 may be checked by check of the display quality, and the control conditions for the light emitting cells 11 in the unit regions 10 may be adjusted to reduce a difference in brightness between adjacent unit regions 10. In this case, uniformity of in-plane brightness can be improved not only in a boundary portion between adjacent self-light emitting units 1 but also in the self-light emitting device 100 as a whole.

The switching elements connected to the self-light emitting elements 5 of the light emitting cells 11 are connected to the driving ICs, and the driving ICs are electrically connected to an external control substrate via a flexible substrate and the like. The driving ICs output the drive signals or the video signals based on signals input from the control substrate via the flexible substrate and the like, and the signals output from the driving ICs are supplied to the switching elements via the metal thin film wires. The switching elements operate the self-light emitting elements 5 in accordance with the supplied signals. Light emitted by the light emitting cells 11 of the self-light emitting unit 1 are thus controlled in accordance with the drive signals or the video signals, and an image is displayed in the active area.

A method for controlling the self-light emitting elements 5 is not limited to the above-mentioned method. When the self-light emitting device 100 is a local dimming backlight, for example, one switching element may operate three LED elements, namely, the red LED element 5R, the green LED element 5G, and the blue LED element 5B. For example, a pixel driving IC may operate the self-light emitting elements 5 of each of the light emitting cells 11. When the pixel driving IC operates the self-light emitting elements 5 of each of the light emitting cells 11, one pixel driving IC typically operates each of the light emitting cells 11.

As described above, according to the self-light emitting device 100 according to Embodiment 1, the central portion and the outer edge portion of each self-light emitting unit 1 differ in number of light emitting cells 11 in each unit region 10, so that a lighting method (the control conditions) in the unit regions 10 in the outer edge portion of the self-light emitting unit 1 can be adjusted independently of that in the central portion. Thus, even if a mismatch of a pixel pitch (pitch between light emitting cells 11) occurs between adjacent self-light emitting units 1, a boundary between the self-light emitting units 1 can be made less noticeable by adjusting the lighting method in the unit regions 10 in the outer edge portion of the self-light emitting unit 1.

Embodiment 2

FIG. 6 is a schematic plan view illustrating a configuration of self-light emitting units 1 according to Embodiment 2, and illustrates a configuration of a boundary portion among the self-light emitting units 1 of the self-light emitting device 100. In Embodiment 1, a plurality of light emitting cells 11 in each of the unit regions 10 in the outer edge portion of the self-light emitting unit 1 are arranged to be spaced apart from one another. In contrast, in Embodiment 2, the plurality of light emitting cells 11 in each of the unit regions 10 in the outer edge portion of the self-light emitting unit 1 are formed as an integrated body.

In an example of FIG. 6, each of the unit regions 10 in the linear portions of the outer edge of the self-light emitting unit 1 includes an integrated body including two light emitting cells 11, and each of the unit regions 10 in the corner portions of the outer edge of the self-light emitting unit 1 includes an integrated body including four light emitting cells 11.

According to the present embodiment, the plurality of light emitting cells 11 can be implemented over the backplane 2 as a single integrated body, so that an effect of simplifying a process of implementing the plurality of light emitting cells 11 over the backplane 2 and reducing a manufacturing cost can be obtained in addition to the effect obtained in Embodiment 1.

Embodiment 3

In the self-light emitting unit 1 illustrated in FIGS. 2 and 3, the two light emitting cells 11 in each of the unit regions 10 in the linear portions of the outer edge of the self-light emitting unit 1 are arranged in the direction perpendicular to the outer edge of the self-light emitting unit 1 (boundary of the adjacent self-light emitting unit 1). In this case, when a direction of a pixel pitch mismatch between adjacent self-light emitting units 1 is perpendicular to a boundary between the self-light emitting units 1, the boundary can effectively be made less noticeable. When the direction of the pixel pitch mismatch between the adjacent self-light emitting units 1 is along the boundary between the self-light emitting units 1, however, it is difficult to make the boundary less noticeable. Embodiment 3 thus shows a configuration of the self-light emitting unit 1 that is effective when the direction of the pixel pitch mismatch between the adjacent self-light emitting units 1 is along the boundary between the self-light emitting units 1.

FIG. 7 is a schematic plan view illustrating a configuration of self-light emitting units 1 according to Embodiment 3, and illustrates a configuration of a boundary portion among the self-light emitting units 1 of the self-light emitting device 100. In each of the self-light emitting units 1 in FIG. 7, each of the unit regions 10 in the central portion of the self-light emitting unit 1 includes one light emitting cell 11, each of the unit regions 10 in the linear portions of the outer edge of the self-light emitting unit 1 includes three light emitting cells 11, and each of the unit regions 10 in the corner portions of the outer edge of the self-light emitting unit 1 includes four light emitting cells 11. In particular, Embodiment 3 differs from Embodiment 1 in that the three light emitting cells 11 in each of the unit regions 10 in the linear portions of the outer edge of the self-light emitting unit 1 are arranged to be offset in a direction along the outer edge of the self-light emitting unit 1.

As described above, in the present embodiment, each of the unit regions 10 in the outer edge portion of the self-light emitting unit 1 includes two or more light emitting cells 11 arranged to be offset in the direction along the outer edge of the self-light emitting unit 1. Thus, according to the present embodiment, when the direction of the pixel pitch mismatch between the adjacent self-light emitting units 1 is along the boundary between the self-light emitting units 1, the boundary can effectively be made less noticeable by adjusting the lighting method for the light emitting cells 11 in the unit regions 10 in the outer edge portion of the self-light emitting unit 1.

Embodiment 4

An example in which Embodiments 2 and 3 are combined is shown in Embodiment 4. FIG. 8 is a schematic plan view illustrating a configuration of self-light emitting units 1 according to Embodiment 4, and illustrates a configuration of a boundary portion among the self-light emitting units 1 of the self-light emitting device 100. In Embodiment 4, each of the unit regions 10 in the outer edge portion of the self-light emitting unit 1 includes two or more light emitting cells 11 arranged to be offset in the direction along the outer edge of the self-light emitting unit 1, and these light emitting cells 11 are formed as an integrated body.

In an example of FIG. 8, each of the unit regions 10 in the linear portions of the outer edge of the self-light emitting unit 1 includes an integrated body including four light emitting cells 11, and each of the unit regions 10 in the corner portions of the outer edge of the self-light emitting unit 1 includes an integrated body including nine light emitting cells 11. In particular, three out of the four light emitting cells 11 in each of the unit regions 10 in the linear portions of the outer edge of the self-light emitting unit 1 are arranged to be offset in the direction along the outer edge of the self-light emitting unit 1.

According to the present embodiment, the effects obtained in Embodiments 2 and 3 can both be obtained.

Embodiment 5

FIG. 9 is a schematic plan view illustrating a configuration of self-light emitting units 1 according to Embodiment 5, and illustrates a configuration of a boundary portion among the self-light emitting units 1 of the self-light emitting device 100. In each of the self-light emitting units 1 in Embodiment 5, each of the unit regions 10 in the central portion of the self-light emitting unit 1 and the unit regions 10 in the outer edge portion of the self-light emitting unit 1 includes one light emitting cell 11. However, the central portion and the outer edge portion of the self-light emitting unit 1 differ in position of the light emitting cell 11 in each of the unit regions 10.

That is to say, in unit regions 10 in the central portion of the self-light emitting unit 1, the position of the light emitting cell 11 in each of the unit regions 10 is constant, but, in unit regions 10 in the outer edge portion of the self-light emitting unit 1, the position of the light emitting cell 11 in each of the unit regions 10 is not constant. More specifically, in the central portion of the self-light emitting unit 1, the light emitting cell 11 is located at the center of each of the unit regions 10. In the outer edge portion of the self-light emitting unit 1, however, the position of the light emitting cell 11 in each of the unit regions 10 is determined so that light emitting cells 11 have two or more types of distances from the outer end of the self-light emitting unit 1 in a plurality of unit regions 10 arranged in the direction along the outer edge. In an example of FIG. 9, in the outer edge portion of the self-light emitting unit 1, the light emitting cells 11 are staggered, and have two types of distances from the outer end of the self-light emitting unit 1 in the plurality of unit regions 10 arranged in the direction along the outer edge.

Thus, in the self-light emitting device 100 according to Embodiment 5, there are two or more types of spaces between light emitting cells 11 in adjacent unit regions 10 across a boundary between self-light emitting units 1. The two or more types of spaces include a space smaller than a space (pitch) between light emitting cells 11 in adjacent unit regions 10 in the central portion of the self-light emitting unit 1. That is to say, when a plurality of self-light emitting units 1 are arranged, pairs of light emitting cells 11 having a space therebetween smaller than the pitch between the light emitting cells 11 in the central portion of the self-light emitting unit 1 are formed across a boundary between adjacent self-light emitting units 1.

Even if a width of the boundary between the adjacent self-light emitting units 1 is increased due to the pixel pitch mismatch between the self-light emitting units 1, there are the pairs of light emitting cells 11 having a smaller space therebetween across the boundary, so that the boundary can be made less noticeable by adjusting the control conditions for the pairs.

Furthermore, in the present embodiment, each of the unit regions 10 in the outer edge portion of the self-light emitting unit 1 is not required to include a greater number of light emitting cells 11 than each of the unit regions 10 in the central portion of the self-light emitting unit 1, so that the number of required light emitting cells 11 can be reduced, and an increase in manufacturing cost can be suppressed compared with Embodiments 1 to 4.

While FIG. 9 illustrates a configuration in which the light emitting cells 11 are staggered, that is, every second light emitting cell 11 is relatively close to the outer end of the self-light emitting unit 1 in a plurality of unit regions 10 arranged in the outer edge portion of the self-light emitting unit 1, arrangement is not limited to that in this example. For example, every third or every fourth light emitting cell 11 may be relatively close to the outer end of the self-light emitting unit 1 in the plurality of unit regions 10 arranged in the outer edge portion of the self-light emitting unit 1.

Embodiments can freely be combined with each other, and can be modified or omitted as appropriate.

The foregoing description is in all aspects illustrative, and it is understood that numerous unillustrated modifications can be devised.

EXPLANATION OF REFERENCE SIGNS

1 self-light emitting unit, 2 backplane, 100 self-light emitting device, 10 unit region, 5 self-light emitting element, 5R red LED element, 5G green LED element, 5B blue LED element, 11 light emitting cell.

The invention claimed is:

1. A self-light emitting device in a tiling scheme including an array of a plurality of self-light emitting units, wherein
   each of the self-light emitting units is partitioned into a plurality of unit regions,
   each of the unit regions includes at least one light emitting cell, each light emitting cell including one or more self-light emitting elements,
   a central portion and an outer edge portion of each self-light emitting unit differ in number or positions of one or more light emitting cells in each unit region, and
   each of unit regions in the outer edge portion of the self-light emitting unit includes a greater number of light emitting cells than each of unit regions in the central portion of the self-light emitting unit.

2. The self-light emitting device according to claim 1, wherein
   only unit regions in an outermost edge portion of the self-light emitting unit differ from unit regions in the central portion of the self-light emitting unit in number or positions of one or more light emitting cells in each unit region.

3. The self-light emitting device according to claim 1, wherein
   from among the unit regions in the outer edge portion of the self-light emitting unit, each of unit regions in corner portions of an outer edge of the self-light emitting unit includes a greater number of light emitting cells than each of unit regions in linear portions of the outer edge of the self-light emitting unit.

4. The self-light emitting device according to claim 1, wherein each of unit regions in the outer edge portion of the self-light emitting unit includes two or more light emitting cells differing in distance from an outer end of the self-light emitting unit.

5. The self-light emitting device according to claim 1, wherein
   each of unit regions in the outer edge portion of the self-light emitting unit includes two or more light emitting cells arranged to be offset in a direction along an outer edge of the self-light emitting unit.

6. The self-light emitting device according to claim 1, wherein
   each of unit regions at least in the outer edge portion of the self-light emitting unit includes a plurality of light emitting cells, and
   the plurality of light emitting cells are formed as an integrated body.

7. The self-light emitting device according to claim 1, wherein
   each of unit regions at least in the outer edge portion of the self-light emitting unit includes a plurality of light emitting cells, and
   from among the plurality of light emitting cells in each of the unit regions in the outer edge portion of the self-light emitting unit, at least one light emitting cell is a basic cell controlled in a similar manner to each light emitting cell in unit regions in the central portion of the self-light emitting unit, and one or more light emitting cells other than the basic cell are correction cells used for correction of brightness in a boundary portion among self-light emitting units.

8. The self-light emitting device according to claim 1, wherein
   in unit regions in the central portion of the self-light emitting unit, a position of the light emitting cell in each of the unit regions is constant, and
   in unit regions in the outer edge portion of the self-light emitting unit, a position of the light emitting cell in each of the unit regions is not constant.

9. The self-light emitting device according to claim 8, wherein
   in the unit regions in the outer edge portion of the self-light emitting unit, the position of the light emitting cell in each of the unit regions is determined so that light emitting cells have two or more types of distances from an outer end of the self-light emitting unit in a plurality of unit regions arranged in a direction along an outer edge of the self-light emitting unit.

10. The self-light emitting device according to claim 8, wherein
   in the unit regions in the outer edge portion of the self-light emitting unit, the position of the light emitting cell in each of the unit regions is determined so that light emitting cells are staggered in a plurality of unit regions arranged in a direction along an outer edge of the self-light emitting unit.

11. The self-light emitting device according to claim 8, wherein
   there are two or more types of spaces between light emitting cells in adjacent unit regions across a boundary between self-light emitting units, and the two or more types of spaces include a space smaller than a space between light emitting cells in adjacent unit regions in the central portion of the self-light emitting unit.

\* \* \* \* \*